United States Patent
Kaneko et al.

(10) Patent No.: US 6,818,258 B2
(45) Date of Patent: *Nov. 16, 2004

(54) RESIST COMPOSITION

(75) Inventors: Isamu Kaneko, Kanagawa (JP); Shinji Okada, Kanagawa (JP); Yasuhide Kawaguchi, Kanagawa (JP); Yoko Takebe, Kanagawa (JP); Shun-ichi Kodama, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/635,514

(22) Filed: Aug. 7, 2003

(65) Prior Publication Data

US 2004/0033439 A1 Feb. 19, 2004

Related U.S. Application Data

(63) Continuation of application No. PCT/JP02/00794, filed on Jan. 31, 2002.

(30) Foreign Application Priority Data

Feb. 9, 2001 (JP) ........................................ 2001-034023
Jul. 19, 2001 (JP) ........................................ 2001-219570

(51) Int. Cl.[7] ........................ B05D 3/06; C08F 214/18; G03F 7/039
(52) U.S. Cl. ........................ 427/553; 427/555; 428/421; 526/249; 430/270.1; 430/913; 430/945
(58) Field of Search .............................. 427/553, 554, 427/557, 558, 555; 428/421; 526/249; 430/270.1, 913, 914, 945

(56) References Cited

U.S. PATENT DOCUMENTS

| | | | | |
|---|---|---|---|---|
| 2,970,988 A | * | 2/1961 | Lo | 260/87.7 |
| 4,654,394 A | * | 3/1987 | Yamabe et al. | 526/247 |
| 5,260,492 A | * | 11/1993 | Feiring et al. | 568/685 |
| 5,475,071 A | * | 12/1995 | Smart et al. | 526/247 |
| 5,589,557 A | * | 12/1996 | Navarrini et al. | 526/247 |
| 6,468,712 B1 | | 10/2002 | Fedynyshyn | |
| 6,670,511 B2 | * | 12/2003 | Kashiwagi et al. | 568/683 |

FOREIGN PATENT DOCUMENTS

| | | | |
|---|---|---|---|
| JP | 02-315770 | * | 11/1990 |
| JP | 03-067262 | * | 3/1991 |
| JP | 9-43856 | | 2/1997 |
| JP | 09-202855 | * | 8/1997 |
| JP | 11-95431 | | 4/1999 |
| JP | 11-305428 | | 11/1999 |
| JP | 2003-330196 A | * | 11/2003 |
| WO | WO 00/17712 | * | 3/2000 |
| WO | WO 00/67072 | | 11/2000 |
| WO | WO 01/63362 A2 | * | 8/2001 |
| WO | WO 02/065212 A1 | * | 8/2002 |

OTHER PUBLICATIONS

Toriumi et al, "Resist materials for 157–nm Lithography"; *Advances in Resist Technology & Processing XVII*, F.Houlihan, ed., Proceeding of SPIE, vol. 4345 , p. 371–378, Feb. 2001.*

Ito et al, "Polymer design for 157 nm Chemically amplified resins"; F. Houlihan, ed, *Advances in Resin Tech. & Processing XVII*, Proceedings & SPIE , vol. 4345 , p. 273–284, Feb. 26, 2001.*

Toriumi et al, "Fluoropolymer–bused resist for a single–r-esist process & 157 nm Lithography"; *J. Vac. Sci Technol. B*, 20(6), p. 2909–2912, Nov./Dec. 2002.*

U.S. patent application Ser. No. 10/637,504, Kaneko et al., filed Aug. 11, 2003.

U.S. patent application Ser. No. 10/376,243, Okada et al., filed Mar. 3, 2003.

* cited by examiner

*Primary Examiner*—Marianne Padgett
(74) *Attorney, Agent, or Firm*—Oblon, Spivak, McClelland, Maier & Neustadt, P.C.

(57) ABSTRACT

To provide a chemical amplification type resist composition which is excellent in transparency to a radiation and in dry etching properties and which gives a resist pattern excellent in sensitivity, resolution, evenness, heat resistance, etc. A resist composition comprising a fluoropolymer (A) which is a fluoropolymer having repeating units formed by cyclopolymerization of a fluorinated diene represented by the formula (1) and which has blocked acidic groups as Q, an acid-generating compound (B) which generates an acid under irradiation with light, and an organic solvent (C):

$$CF_2=CR^1-Q-CR^2=CH_2 \qquad (1)$$

wherein each of $R^1$ and $R^2$ which are independent of each other, is a hydrogen atom, a fluorine atom, a methyl group or a trifluoromethyl group, and Q is a bivalent organic group having a blocked acidic group capable of forming an acidic group by an acid or a group which can be converted to such a blocked acidic group.

9 Claims, No Drawings

RESIST COMPOSITION

TECHNICAL FIELD

The present invention relates to a novel fluorinated resist composition. More particularly, it relates to a chemical amplification type resist composition useful for fine processing employing far ultraviolet rays such as KrF or ArF excimer laser, or vacuum ultraviolet rays such as $F_2$ excimer laser.

BACKGROUND ART

In recent years, along with the progress in fine circuit patterns in the process for producing semiconductor integrated circuits, a photoresist material having high resolution and high sensitivity is desired. As the circuit patterns become fine, a short wavelength of a light source for an exposure apparatus becomes essential. In an application to lithography employing an excimer laser of 250 nm or shorter, a polyvinyl phenol type resin, an alicyclic acrylic type resin or a polynorbornene type resin has, for example, been proposed, but no adequate resolution and sensitivity have been obtained.

It is an object of the present invention to provide a resist composition which is particularly excellent in transparency to a radiation and in dry etching properties, as a chemical amplification type resist and which gives a resist pattern excellent in sensitivity, resolution, evenness, heat resistance, etc.

DISCLOSURE OF THE INVENTION

The present invention is the following invention which has been made to solve the above-described problems.

1) A resist composition comprising a fluoropolymer (A) which is a fluoropolymer having repeating units formed by cyclopolymerization of a fluorinated diene represented by the formula (1) and which has blocked acidic groups, provided that in a case where Q is a bivalent organic group having a group which can be converted to a blocked acidic group, said group is converted to a blocked acidic group after the cyclopolymerization, an acid-generating compound (B) which generates an acid under irradiation with light, and an organic solvent (c):

$$CF_2=CR^1—Q—CR^2=CH_2 \quad (1)$$

wherein each of $R^1$ and $R^2$ which are independent of each other, is a hydrogen atom, a fluorine atom, a methyl group or a trifluoromethyl group, and Q is a bivalent organic group having a blocked acidic group capable of forming an acidic group by an acid or a group which can be converted to such a blocked acidic group.

2) The resist composition according to 1), wherein Q is a bivalent organic group represented by the formula (2):

$$—R^3—C(R^5)(R^6)—R^4— \quad (2)$$

wherein each of $R^3$ and $R^4$ which are independent of each other, is a single bond, an oxygen atom, an alkylene group having at most 3 carbon atoms, which may have an etheric oxygen atom, or a fluoroalkylene group having at most 3 carbon atoms, which may have an etheric oxygen atom, $R^5$ is a hydrogen atom, a fluorine atom, an alkyl group having at most 3 carbon atoms or a fluoroalkyl group having at most 3 carbon atoms, and $R^6$ is a blocked acidic group, an acidic group, or a monovalent organic group having a blocked acidic group or an acidic group.

3) The resist composition according to 1) or 2), wherein the acidic group is an acidic hydroxyl group, and the blocked acidic group is a blocked acidic hydroxyl group.

4) The resist composition according to 1), 2) or 3), wherein the fluorinated diene is a fluorinated diene represented by the formula (4) or (5):

$$CF_2=CFCF_2C(—X^2)(CF_3)CH_2CH=CH_2 \quad (4)$$

$$CF_2=CFCF_2CH(—(CH_2)_pC(CF_3)_2—X^2)CH_2CH=CH_2 \quad (5)$$

wherein $X^2$ is $O(t\text{-}C_4H_9)$, $OCH_2OCH_3$, $OCOO(t\text{-}C_4H_9)$, $OCH(CH_3)OC_2H_5$ or a 2-tetrahydropyranyloxy group, and p is an integer of from 1 to 3.

5) A process for forming a pattern, which comprises coating the resist composition as defined in 1), 2), 3) or 4) on a substrate, then removing the organic solvent (C) to form a thin film of a resist comprising the fluoropolymer (A) and the acid-generating compound (B), and then irradiating the thin film with ultraviolet rays having a wavelength of at most 200 nm capable of generating an acid from the acid-generating compound (B) to form a pattern.

BEST MODE FOR CARRYING OUT THE INVENTION

It is considered that by the cyclopolymerization of the fluorinated diene represented by the formula (1) (hereinafter referred to as the fluorinated diene (1)), the following repeating units (a) to (c) will be formed. From the results of the spectroscopic analyses, etc., the cyclized polymer of the fluorinated diene (1) is considered to be a polymer having a structure comprising repeating units (a), repeating units (b) or both of them, as the main repeating units. Here, the main chain of this cyclized polymer is meant for a carbon chain constituted by carbon atoms which constitute polymerizable unsaturated bonds (in the case of the fluorinated diene (1), the four carbon atoms which constitute polymerizable unsaturated double bonds).

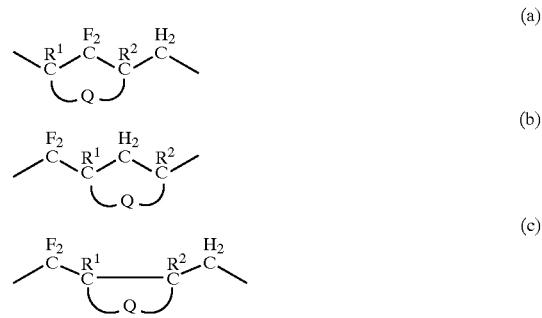

In the formula (1), each of $R^1$ and $R^2$ which are independent of each other, is a hydrogen atom, a fluorine atom, a methyl group or a trifluoromethyl group. $R^1$ is preferably a fluorine atom or a trifluoromethyl group. $R^2$ is preferably a hydrogen atom or a methyl group. Q is a bivalent organic group having a blocked acidic group capable of forming an acidic group (hereinafter referred to simply as a blocked acidic group) or a group which can be converted to such a blocked acidic group (hereinafter referred to as a precursor group). In a case where Q is a bivalent organic group having the precursor group, after the cyclopolymerization of the fluorinated diene (1), the precursor groups in the polymer will be converted to blocked acidic groups.

The fluoropolymer (A) in the present invention has blocked acidic groups. In a case where the fluorinated diene (1) has a blocked acidic group, the fluoropolymer (A) can be obtained by its cyclopolymerization. In a case where the fluorinated diene (1) has the precursor groups, the fluoropolymer (A) can be obtained by converting the precursor groups in the polymer obtained by its cyclopolymerization, to blocked acidic groups. The precursor group may be an acidic group or a group which can be converted to an acidic group. The acidic group can be converted to a blocked acidic group by reacting it with a blocking agent. The group which can be converted to an acidic group, may be a blocked acidic group other than the desired blocked acidic group. By conversion of the blocked portion, it can be converted to the desired blocked acidic group. The blocked ratio of the fluoropolymer (A) (i.e. the ratio of blocked acidic groups to the total of the blocked acidic groups and non-blocked acidic groups) is preferably from 10 to 100 mol %, particularly preferably from 10 to 90 mol %.

In Q, the minimum distance between connecting bonds at its both terminals corresponds preferably to from 2 to 6 atoms, particularly preferably 2 to 4 atoms, as represented by the number of atoms (the atomic chain constituting this minimum distance will be hereinafter referred to as the main chain). The atoms constituting the main chain may be composed of carbon atoms only, or carbon atoms and other bivalent or higher valent atoms. The bivalent or higher valent atoms other than carbon atoms, may, for example, an oxygen atom, a sulfur atom and a nitrogen atom substituted by a monovalent group. An oxygen atom is particularly preferred. Such an oxygen atom or the like may be present at either one or both of the two terminals, or may be present between carbon atoms in Q.

In the main chain in Q, at least one carbon atom is present, and to a carbon atom constituting the main chain in Q, a blocked acidic group, a precursor group or an organic group containing a blocked acidic group or a precursor group, is bonded. In addition to such a specific group, hydrogen atoms or halogen atoms (particularly preferably fluorine atoms) are bonded to carbon atoms, etc. constituting the main chain, and further, an alkyl group, a fluoroalkyl group, an alkoxy group, an aryl group or other organic groups may be bonded thereto. The carbon number of such an organic group is preferably at most 6.

The acidic group may, for example, be an acidic hydroxyl group, a carboxylic group or a sulfonic group, particularly preferably an acidic hydroxyl group and a carboxylic group, most preferably an acidic hydroxyl group. The acidic hydroxyl group is a hydroxyl group showing acidity, and it may, for example, be a hydroxyl group bonded directly to the ring of an aryl group (a phenolic hydroxyl group), a hydroxyl group bonded to a carbon atom having a perfluoroalkyl group (preferably a $C_{1-2}$ perfluoroalkyl group) bonded thereto, a hydroxyl group bonded to a difluoromethylene group, or a hydroxyl group bonded to a tertiary carbon atom. Particularly preferred is a hydroxyl group bonded to a carbon atom having one or two perfluoroalkyl groups bonded thereto. In a case where the perfluoroalkyl group is a trifluoromethyl group, for example, a hydroxyl group in a bivalent group of the following formula (d-1) (i.e. a hydroxyl group in a hydroxytrifluoromethylmethylene group) or a hydroxyl group in a monovalent group of the following formula (d-2) or (d-3) (i.e. a hydroxyl group in a 1-hydroxy-1-trifluoromethyl-2,2,2-trifluoroethyl group or a 1-hydroxy-1-methyl-2,2,2-trifluoroethyl group) is preferred.

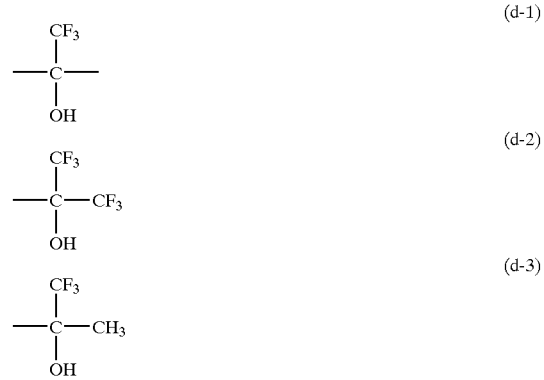

The blocked acidic group can be obtained by reacting a blocking agent to the acidic group as described above. The blocked acidic group is a group which can be converted to an acidic group by an acid which is generated by the acid-generating compound (B) which generates the acid under irradiation with light, in the resist composition. In a case where the acidic group is a carboxylic group or a sulfonic group, a blocking agent such as an alkanol may be reacted to substitute an alkyl group or the like for the hydrogen atom in the acidic group to form a blocked acidic group.

In a case where the acidic group is an acidic hydroxyl group, the blocked acidic group is preferably a blocked acidic group obtainable by substituting an alkyl group, an alkoxycarbonyl group, an acyl group, a cyclic ether group or the like for the hydrogen atom in the acidic hydroxyl group. A preferred alkyl group to be substituted for the hydrogen atom in the hydroxyl group, may be a $C_{1-6}$ alkyl group which may have a substituent (such as an aryl group or an alkoxy group). Specific examples of such an alkyl group include an alkyl group having at most 6 carbon atoms (such as a tert-butyl group (t-$C_4H_9$)), an aryl group-substituted alkyl group having a total carbon number of from 7 to 20 (such as a benzyl group, a triphenylmethyl group, a p-methoxybenzyl group or a 3,4-dimethoxybenzyl group), and an alkoxyalkyl group having a total carbon number of at most 8 (such as a methoxymethyl group, a (2-methoxyethoxy)methyl group or a benzyloxymethyl group). A preferred alkoxycarbonyl group to be substituted for the hydrogen atom of the hydroxyl group, may, for example, be an alkoxycarbonyl group having a total carbon number of at most 8 or a tert-butoxycarbonyl group (—COO(t-$C_4H_9$)). A preferred acyl group to be substituted for the hydrogen atom of the hydroxyl group, may be an acyl group having a total carbon number of at most 8, and it may, for example, be a pivaloyl group, a benzoyl group or an acetyl group. A preferred cyclic ether group to be substituted for the hydrogen atom of the hydroxyl group, may, for example, be a tetrahydropyranyl group.

To block the acidic hydroxyl group, an alcohol, a carboxylic acid or an active derivative thereof is, for example, reacted. The active derivative thereof may, for example, be an alkyl halide, an acid chloride, an acid anhydride, a chlorocarbonic acid ester, a dialkyl dicarbonate (such as di-tert-butyl dicarbonate) or 3,4-dihydro-2H-pyran. Specific examples of the reagent useful for blocking a hydroxyl group are disclosed in Handbook of Reagents for Organic Synthesis: Activating Agents and Protecting Groups, compiled by A. J. Pearson and W. R. Roush, published by John Wiley & Sons (1999).

As the acidic group, an acidic hydroxyl group is particularly preferred, and as the blocked acidic group, a blocked acidic hydroxyl group is preferred. Specifically, as the blocked acidic hydroxyl group, $O(t\text{-}C_4H_9)$, $OCH_2OCH_3$, $OCOO(t\text{-}C_4H_9)$, $OCH(CH_3)OC_2H_5$ or a 2-tetrahydropyranyloxy group is preferred.

Q is preferably a bivalent organic group of the following formula (2). Accordingly, the fluorinated diene (1) is preferably a compound of the following formula (3) (wherein $R^1$ and $R^2$ are as defined above).

  (2)

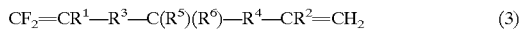  (3)

wherein each of $R^3$ and $R^4$ which are independent of each other, is a single bond, an oxygen atom, an alkylene group having at most 3 carbon atoms, which may have an etheric oxygen atom, or a fluoroalkylene group having at most 3 carbon atoms, which may have an etheric oxygen atom, $R^5$ is a hydrogen atom, a fluorine atom, an alkyl group having at most 3 carbon atoms, or a fluoroalkyl group having at most 3 carbon atoms, and $R^6$ is a blocked acidic group, an acidic group, or a monovalent organic group having a blocked acidic group or an acidic group.

The alkylene group for $R^3$ or $R^4$ is preferably $(CH_2)_n$, and the fluoroalkylene group is preferably $(CF_2)_m$ (each of m and n is an integer of from 1 to 3). In the combination of $R^3$ and $R^4$, it is preferred that both are alkylene groups or fluoroalkylene groups (in such a case, m+n is preferably 2 or 3), or one of them is an alkylene group or a fluoroalkylene group, and the other is a single bond or an oxygen atom. The alkyl group for $R^5$ is preferably a methyl group, and the fluoroalkyl group for $R^5$ is preferably a trifluoromethyl group.

$R^6$ in the case of a monovalent organic group, is preferably an organic group having at most 8 carbon atoms, and the moiety excluding the blocked acidic group or the acidic group, is preferably a hydrocarbon group or a fluorohydrocarbon group. Particularly preferred is a $C_{2\text{-}6}$ alkyl group, a $C_{2\text{-}6}$ fluoroalkyl group or a $C_{7\text{-}9}$ phenylalkyl group, which has a blocked acidic group or an acid group (provided that in the phenylalkyl group, the blocked acidic group or the like is bonded to the phenyl group). Specifically, the following groups may be mentioned as $R^6$ (wherein k is an integer of from 1 to 6, and X is a blocked acidic group or an acidic group).

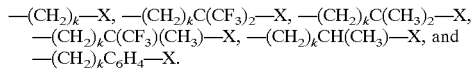

Compounds of the following chemical formulae may be mentioned as preferred examples of the fluorinated diene (1).

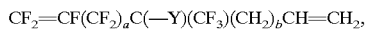

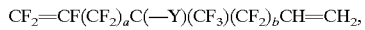

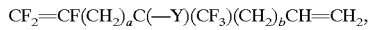

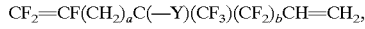

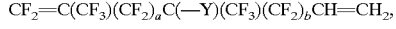

and

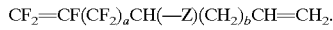

In the above formulae, Y is $X^1$ or $-R^7-X^1$, Z is $-R^7X^1$, wherein $X^1$ is OH, $O(t\text{-}C_4H_9)$, $OCH_2OCH_3$, $OCOO(t\text{-}C_4H_9)$, $OCH(CH_3)OC_2H_5$ or a 2-tetrahydropyranyloxy group, and $R^7$ is $(CH_2)_pC(CF_3)_2$, $(CH_2)_pC(CF_3)(CH_3)$ or $(CH_2)_pC_6H_4$. Further, each of a and b which are independent of each other, is an integer of from 0 to 3 (provided that a+b is from 1 to 3), and p is an integer of from 1 to 3. The most preferred $X^1$ is $O(t\text{-}C_4H_9)$, $OCH_2OCH_3$, $OCOO(t\text{-}C_4H_9)$, $OCH(CH_3)OC_2H_5$ or a 2-tetrahydropyranyloxy group, and the most preferred $R^7$ is $(CH_2)_pC(CF_3)_2$. Each of a and b is most preferably 1.

The most preferred fluorinated diene (1) is a compound of the following formula (4) or (5).

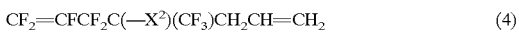  (4)

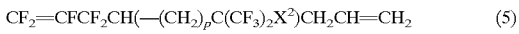  (5)

wherein $X^2$ is $O(t\text{-}C_4H_9)$, $OCH_2OCH_3$, $OCOO(t\text{-}C_4H_9)$, $OCH(CH_3)OC_2H_5$ or a 2-tetrahydropyranyloxy group, and p is an integer of from 1 to 3.

The fluoropolymer (A) contains, as essential components, repeating units formed by cyclopolymerization of the fluorinated diene represented by the formula (1), but it may contain monomeric units derived from other radical polymerizable monomers within a range not to impair its characteristics. The proportion of other monomeric units is preferably at most 30 mol %, particularly preferably at most 15 mol %. Further, the fluoropolymer (A) may contain at least two types of fluorinated diene units represented by the formula (1).

Such other monomeric units may, for example, be monomeric units derived from e.g. α-olefins such as ethylene, propylene and isobutylene, fluorinated olefins such as tetrafluoroethylene and hexafluoropropylene, fluorinated cyclic monomers such as perfluoro(2,2-dimethyl-1,3-dioxole, cyclopolymerizable perfluorodienes such as perfluoro(butenyl vinyl ether), (meth)acrylates such as methylacrylate and ethyl methacrylate, vinyl carboxylate esters such as vinyl acetate, vinyl benzoate and vinyl adamantylate, alkyl vinyl ethers such as ethyl vinyl ether and cyclohexyl vinyl ether, cyclic olefins such as cyclohexene, norbornene and norbornadiene, maleic anhydride, vinyl chloride, etc.

Further, a monomer having a blocked acidic group may also supplementarily be used. As such a monomer, a (meth)acrylate such as tert-butyl acrylate, tert-butyl methacrylate or tetrahydropyranyl acrylate, an alkyl vinyl ether such as tert-butyl vinyl ether, $CH_2=CHCH_2C(CF_3)_2OCO_2\text{-}t\text{-}C_4H_9$ or $CH_2=CHCH_2C(CF_3)_2OCH(CH_3)OC_2H_5$, may, for example, be mentioned.

The molecular weight of the fluoropolymer (A) having a cyclic structure is not particularly limited so long as it can be uniformly dissolved in an organic solvent which will be described hereinafter and it can be uniformly coated on a substrate. However, usually, its number average molecular weight as calculated as polystyrene is suitably from 1,000 to 100,000, preferably from 2,000 to 20,000. If the number average molecular weight is less than 1,000, a trouble is likely to result such that the obtainable resist pattern tends to be poor, the film remaining rate after development tends to be low, or the dimensional stability during the heat treatment of the pattern tends to deteriorate. On the other hand, if the number average molecular weight exceeds 100,000, the coating property of the composition is likely to be poor, or the developability may deteriorate.

The fluoropolymer (A) can be obtained by homopolymerizing or copolymerizing the above-mentioned monomer in the presence of a polymerization initiator. Otherwise, a fluoropolymer may be produced by using the corresponding non-blocked monomer, and then acidic groups in the fluoropolymer may be blocked by a blocking agent to obtain the fluoropolymer (A). The polymerization initiator is not particularly limited so long as it lets the polymerization reaction proceed radically. For example, it may be a radical-generating agent, light or ionizing radiation. Particularly preferred is a radical-generating agent, and a peroxide, an azo compound or a persulfate may, for example, be mentioned.

The polymerization method is also not particularly limited, and so-called bulk polymerization in which monomers are subjected to polymerization as they are, solution polymerization which is carried out in a fluorohydrocarbon, a chlorohydrocarbon, a fluorinated chlorohydrocarbon, an alcohol, a hydrocarbon or other organic solvent, capable of dissolving the monomers, suspension polymerization which is carried out in an aqueous medium in the absence or presence of a suitable organic solvent, or emulsion polymerization which is carried out by adding an emulsifier to an aqueous medium, may, for example, be mentioned.

The acid-generating compound (B) which generates an acid under irradiation with light, will cleave the blocked groups present in the polymer by the action of the acid generated by exposure. As a result, the exposed portions of the resist film will be readily soluble by an alkaline developer, whereby a positive resist pattern will be formed. As such an acid-generating compound (B) which generates an acid under irradiation with light, it is possible to employ an acid-generating compound which is commonly used for a chemical amplification type resist material. Namely, an onium salt, a halogenated compound, a diazoketone compound, a sulfone compound or a sulfonic compound, may, for example, be mentioned. The following may be mentioned as examples of such an acid-generating compound (B).

The onium salt may, for example, be an iodonium salt, a sulfonium salt, a phosphonium salt, a diazonium salt or a pyridinium salt. Specific examples of a preferred onium salt include diphenyliodonium triflate, diphenyliodonium pyrenesulfonate, diphenyliodonium dodecylbenzenesulfonate, bis(4-tert-butylphenyl)iodonium triflate, bis(4-tert-butylphenyl)iodonium dodecylbenzenesulfonate, triphenylsulfonium triflate, triphenylsulfonium hexafluoroantimonate, 1-(naphthylacetomethyl)thioranium triflate, cyclohexylmethyl(2-oxocyclohexyl)sulfonium triflate, dicyclohexyl(2-oxocyclohexyl)sulfonium triflate, dimethyl (4-hydroxynaphthyl)sulfonium tosylate, dimethyl(4-hydroxynaphthyl)sulfonium dodecylbenzenesulfonate, dimethyl(4-hydroxynaphthyl)sulfoniumnaphthalene sulfonate, triphenylsulfonium camphorsulfonate and (4-hydroxyphenyl)benzylmethylsulfonium toluenesulfonate.

The halogenated-compound may, for example, be a haloalkyl group-containing hydrocarbon compound or a haloalkyl group-containing heterocyclic compound. Specifically, it may, for example, be a (trichloromethyl)-s-triazine derivative such as phenyl-bis(trichloromethyl)-s-triazine, methoxyphenyl-bis(trichloromethyl)-s-triazine or naphthyl-bis(trichloromethyl)-s-triazine, or 1,1-bis(4-chlorophenyl)-2,2,2-trichloroethane.

The sulfone compound may, for example, be β-ketosulfone, β-sulfonylsulfone or an α-diazo compound of such a compound. Specifically, it may, for example, be 4-trisphenacylsulfone, methylphenacylsulfone or bis (phenylsulfonyl)methane. The sulfonic compound may, for example, be an alkylsulfonic acid ester, an alkylsulfonic acid imide, a haloalkylsulfonic acid ester, an arylsulfonic acid ester or an iminosulfonate. Specifically, it may, for example, be benzoin tosylate or 1,8-naphthalene dicarboxylic acid imide triflate. In the present invention, such acid-generating compounds (B) may be used alone or in combination as a mixture of two or more of them.

The organic solvent of component (C) is not particularly limited so long as it is capable of dissolving both components (A) and (B). It may, for example, be an alcohol such as methyl alcohol or ethyl alcohol, a ketone such as acetone, methyl isobutyl ketone or cyclohexanone, an acetate such as ethyl acetate or butyl acetate, an aromatic hydrocarbon such as toluene or xylene, a glycol monoalkyl ether such as propylene glycol monomethyl ether or propylene glycol monoethyl ether, or a glycol monoalkyl ether ester such as propylene glycol monomethyl ether acetate or carbitol acetate.

The proportions of the respective components in the resist composition of the present invention are usually such that per 100 parts by mass of the fluoropolymer (A), the acid-generating compound (B) is from 0.1 to 20 parts by mass, and the organic solvent (C) is from 50 to 2,000 parts by mass. Preferably, per 100 parts by mass of the fluoropolymer (A), the acid-generating compound (B) is from 0.1 to 10 parts by mass, and the organic solvent (C) is from 100 to 1,000 parts by mass.

If the amount of the acid-generating compound (B) is less than 0.1 part by mass, the sensitivity and developability tend to be poor, and if it exceeds 10 parts by mass, the transparency to radiation tends to deteriorate, whereby an accurate resist pattern will hardly be obtained.

To the resist composition of the present invention, an acid-cleavable additive to improve the pattern contrast, a surfactant to improve the coating property, a nitrogen-containing basic compound to adjust the acid-generating pattern, an adhesion-assisting agent to improve the adhesion to the substrate or a storage stabilizer to increase the storage stability of the composition, may, for example, be optionally incorporated. Further, the resist composition of the present invention is preferably employed in such a manner that the respective components are uniformly mixed, followed by filtration by means of a filter of from 0.1 to 2 μm.

The resist composition of the present invention is coated on a substrate such as a silicone wafer, followed by drying to form a resist film. As the coating method, spin coating, cast coating or roll coating may, for example, be employed. The formed resist film will be irradiated with light via a mask having a pattern drawn thereon, followed by development treatment to form the pattern.

The light beams for the irradiation may, for example, be ultraviolet rays such as g-line having a wavelength of 436 nm or i-line having a wavelength of 365 nm, or far ultraviolet rays or vacuum ultraviolet rays, such as KrF excimer laser having a wavelength of 248 mm, ArF excimer laser having a wavelength of 193 nm or $F_2$ excimer laser having a wavelength of 157 nm. The resist composition of the present invention is a resist composition useful particularly for an application where ultraviolet rays having a wavelength of at most 250 nm, especially ultraviolet rays having a wavelength of at most 200 nm (such as ArF laser or $F_2$ laser), are used as the light source.

As the development treatment solution, various alkali aqueous solutions are employed. As such alkali, sodium hydroxide, potassium hydroxide, ammonium hydroxide, tetramethyl ammonium hydroxide or triethylamine may, for example, be mentioned.

EXAMPLES

Now, the present invention will be described in further detail with reference to Examples. However, it should be understood that the present invention is by no means restricted by such specific Examples. Here, THF represents tetrahydrofuran, and PTFE represents polytetrafluoroethylene.

Preparation Example for the Fluorinated Diene (1)

Preparation Example 1
Preparation of $CF_2=CFCF_2C(CF_3)(OH)CH_2CH=CH_2$

Into a 2 L reactor made of glass, 108 g of $CF_2ClCFClCF_2C(O)CF_3$ and 500 ml of dehydrated THF were charged and cooled to 0° C. A diluted solution having 200 ml of a 2M THF solution of $CH_2=CHCH_2MgCl$ further diluted with 200 ml of dehydrated THF, was dropwise added thereto in a nitrogen atmosphere over a period of about 5.5 hours. After completion of the dropwise addition, the mixture was stirred at 0° C. for 30 minutes and at room temperature for 17 hours, whereupon 200 ml of 2N hydrochloric acid was dropwise added. 200 ml of water and 300 ml of diethyl ether were added for liquid separation, and a diethyl ether layer was obtained as an organic layer. The organic layer was dried over magnesium sulfate, followed by filtration to obtain a crude liquid. The crude liquid was concentrated by an evaporator, followed by distillation under reduced pressure to obtain 85 g of $CF_2ClCFClCF_2C(CF_3)(OH)CH_2CH=CH_2$ (60 to 66° C./0.7 kPa).

Then, into a 500 ml reactor made of glass, 81 g of zinc and 170 ml of dioxane were charged, and activation of zinc was carried out by iodine. The reactor was heated to 100° C., and a solution prepared by diluting 84 g of $CF_2ClCFClCF_2C(CF_3)(OH)CH_2CH=CH_2$ synthesized as described above, with 50 ml of dioxane, was dropwise added thereto over a period of 1.5 hours. After completion of the dropwise addition, the mixture was stirred at 100° C. for 40 hours. The reaction solution was filtered and washed with a small amount of dioxane. The filtrate was distilled under reduced pressure to obtain 30 g of $CF_2=CFCF_2C(CF_3)(OH)CH_2CH=CH_2$ (36 to 37° C./1 kPa).

NMR Spectrum $^1H$ NMR (399.8 MHz, solvent: $CDCl_3$, standard: tetramethylsilane) δ (ppm): 2.74 (d, J=7.3, 2H) 3.54 (broad s, 1H), 5.34 (m, 2H), 5.86 (m, 1H).

$^{19}F$ NMR (376.2 MHz, solvent: $CDCl_3$, standard: $CFCl_3$) δ (ppm): -75.7 (m, 3F), -92.2 (m, 1F), -106.57 (m, 1F), -112.6 (m, 2F), -183.5 (m, 1F).

Further, the hydroxyl group-containing fluorinated diene obtained as described above, is reacted with zinc-tert-butyl dicarbonate to convert the hydroxyl group to a tert-butoxycarbonyloxy group.

Preparation Examples for the Fluoropolymer (A)

Preparation Example 2

13.7 g of 1,1,2,3,3-pentafluoro-4-trifluoromethyl-4-tert-butoxycarbonyloxy-1,6-heptadiene $[CF_2=CFCF_2C(CF_3)(OCOO-t-C_4H_9)CH_2CH=CH_2]$ and 23 g of methyl acetate were charged into a pressure resistant reactor made of glass having an internal capacity of 50 cc. Then, 0.30 g of perfluorobenzoyl peroxide was added as a polymerization initiator. The interior of the system was freeze-deaerated, and then, polymerization was carried out for 6 hours in a constant temperature shaking vessel (70° C.). After the polymerization, the reaction solution was dropwise added into hexane to reprecipitate the polymer, followed by vacuum drying at 80° C. for 16 hours. As a result, 10.0 g of a non-crystalline polymer having a fluorinated cyclic structure in its main chain (hereinafter referred to as polymer 1A) was obtained. The molecular weight of polymer 1A was measured by GPC, whereby as calculated as a polystyrene, the number average molecular weight (Mn) was 12,200, and the weight average molecular weight (Mw) was 36,600, whereby Mw/Mn=3.00. The glass transition point was 155° C., and the polymer was a white powder at room temperature.

Preparation Example 3

10 g of 1,1,2,3,3-pentafluoro-4-trifluoromethyl-4-hydroxy-1,6-heptadiene $[CF_2=CFCF_2C(CF_3)(OH)CH_2CH=CH_2]$ and 23 g of methyl acetate were charged into a pressure resistant reactor made of glass having an internal capacity of 50 cc. Then, 0.24 g of perfluorobenzoyl peroxide was added as a polymerization initiator. The interior of the system was freeze-deaerated, and then, polymerization was carried out for 6 hours in a constant temperature shaking vessel (70° C.). After the polymerization, the reaction solution was dropwise added into hexane to reprecipitate the polymer, followed by vacuum drying at 150° C. for 12 hours. As a result, 8 g of a non-crystalline polymer having a fluorinated cyclic structure in its main chain (hereinafter referred to as polymer 2A) was obtained. The molecular weight of polymer 2A was measured by GPC, whereby as calculated as a polystyrene, the number average molecular weight (Mn) was 14,200, and the weight average molecular weight (Mw) was 41,300, whereby Mw/Mn=2.91. The glass transition point was 148° C., and the polymer was a white powder at room temperature.

Into a 300 ml three-necked flask, 0.65 g of sodium hydrate (60%) and 16 ml of THF were put and thoroughly stirred by a magnetic stirrer, whereupon the flask was immersed in an ice bath. A solution having 4 g of polymer 2A (hydroxyl group concentration: 6.3 mass %) dissolved in 40 ml of THF, was dropwise added. After completely adding the polymer solution, when foaming ceased, the flask was taken out from the ice bath and returned to room temperature. A solution having 3.56 g of di-tert-butyl dicarbonate preliminarily dissolved in 16 ml of THF, was added to the flask, followed by stirring overnight at room temperature. When ice water was added to treat excess sodium hydride, a polymer precipitated. This polymer was washed twice with water, and then, this polymer was dissolved in acetone. This polymer solution was flocculated with hexane, and the flocculated polymer was washed twice with hexane. The obtained polymer was dried at 70° C. for 16 hours in a vacuum drier to obtain 2.5 g of a polymer having hydroxyl groups blocked with tert-butoxy carbonyl groups (hereinafter referred to as polymer 2B). By $^1H$-NMR (tert-butyl group of the tert-butoxycarbonyl group: 1.52 ppm (9H)), it was confirmed that 65% of hydroxyl groups were blocked.

Preparation Example 4

Into a 300 ml three-necked flask, 0.01 g of cobalt dichloride (anhydrous) and 30 ml of acetonitrile were put and thoroughly stirred by a magnetic stirrer. A polymer solution having 4 g of polymer 2A obtained in Preparation Example 3 (hydroxyl group concentration: 6.3 mass %) and 1.6 g of ethyl vinyl ether dissolved in 70 ml of dimethyl sulfoxide, was dropwise added to the cobalt dichloride solution. At that time, the reaction solution was maintained at room temperature. After completion of the dropwise addition, the mixture was stirred overnight at room temperature. This reaction solution was put into a saturated sodium hydrogencarbonate aqueous solution, and the precipitated polymer was recovered and washed twice with water. This polymer was dissolved in acetone and flocculated with hexane. The flocculated polymer was washed twice with hexane. The obtained polymer was dried at 80° C. for 16 hours in a vacuum drier to obtain 1.8 g of a polymer blocked with 1-ethoxyethyl groups (hereinafter referred to as polymer 2C). By $^1$H-NMR (methine of the ethoxyethyl group: 4.13 ppm (1H)), it was confirmed that 60% of hydroxyl groups were blocked.

Example 1

1 g of polymer 1A and 0.05 g of trimethylsulfonium triflate were dissolved in 7 g of propylene glycol monomethyl ether acetate, followed by filtration by means of a PTFE filter having a pore diameter of 0.2 μm to obtain a resist composition. The above resist composition was spin-coated on a silicon substrate treated with hexamethyldisilazane, followed by heat treatment at 80° C. for 2 minutes to form a resist film having a thickness of 0.3 μm. The absorption spectrum of this film was measured by an ultraviolet ray photometer, whereby the transmittance of a light of 193 nm was 78%, and the transmittance of a light of 157 nm was 38%.

In an exposure test apparatus flushed with nitrogen, the substrate having the above resist film formed, was placed, and a mask having a pattern drawn by chromium on a quartz plate, was put thereon in close contact therewith. ArF excimer laser beams were irradiated through the mask, whereupon, after exposure at 100° C. for 2 minutes, baking was carried out. The development was carried out at 23° C. for 3 minutes with a tetramethylammonium hydroxide aqueous solution (2.38 mass %), followed by washing with pure water for 1 minute. As a result, at an exposure of 19 mJ/cm$^2$, only the exposed portions of the resist film were dissolved and removed by the developer, whereby a positive 0.25 μm line and space pattern was obtained.

Example 2

1 g of polymer 2B prepared in Preparation Example 3 and 0.05 g of trimethylsulfonium triflate were dissolved in 7 g of propylene glycol monomethyl ether acetate, followed by filtration by means of a PTFE filter having a pore diameter of 0.2 μm to obtain a resist composition. The above resist composition was spin-coated on a silicon substrate treated with hexamethyldisilazane, followed by heat treatment at 80° C. for 2 minutes to form a resist film having a thickness of 0.3 μm. The absorption spectrum of this film was measured by an ultraviolet ray photometer, whereby the transmittance of a light of 193 nm was 69%, and the transmittance of a light of 157 nm was 45%.

In an exposure test apparatus flushed with nitrogen, the substrate having the above resist film formed, was placed, and a mask having a pattern drawn by chromium on a quartz plate, was put thereon in close contact therewith. ArF excimer laser beams were irradiated through the mask, whereupon, after exposure at 100° C. for 2 minutes, baking was carried out. The development was carried out at 23° C. for 3 minutes with a tetramethylammonium hydroxide aqueous solution (2.38 mass %), followed by washing with pure water for 1 minute. As a result, at an exposure of 30 mJ/cm$^2$, only the exposed portions of the resist film were dissolved and removed by the developer, whereby a positive 0.25 μm line and space pattern was obtained.

Example 3

1 g of polymer 2C prepared in Preparation Example 4 and 0.05 g of trimethylsulfonium triflate were dissolved in 7 g of propylene glycol monomethyl ether acetate, followed by filtration by means of a PTFE filter having a pore diameter of 0.1 μm to obtain a resist composition. The above resist composition was spin-coated on a silicon substrate treated with hexamethyldisilazane, followed by heat treatment at 80° C. for 2 minutes to form a resist film having a thickness of 0.3 μm. The absorption spectrum of this film was measured by an ultraviolet visible light photometer, whereby the transmittance of a light of 193 nm was 82%, and the transmittance of a light of 157 nm was 51%.

In an exposure test apparatus flushed with nitrogen, the substrate having the above resist film formed, was placed, and a mask having a pattern drawn by chromium on a quartz plate, was put thereon in close contact therewith. ArF excimer laser beams were irradiated through the mask, whereupon, after exposure at 100° C. for 2 minutes, baking was carried out. The development was carried out at 23° C. for 3 minutes with a tetramethylammonium hydroxide aqueous solution (2.38 mass %), followed by washing with pure water for 1 minute. As a result, at an exposure of 18 mJ/cm$^2$, only the exposed portions of the resist film were dissolved and removed by the developer, whereby a positive 0.25 μm line and space pattern was obtained.

Example 4

The etching resistance of the resist films of Examples 1 to 3 was measured.

TABLE 1

| Resist film | Etching resistance |
|---|---|
| Example 1 | ⊚ |
| Example 2 | ⊚ |
| Example 3 | ○ |

Etching resistance: The etching rate was measured by an argon/octafluorocyclobutane/oxygen mixed gas plasma, whereby when a novolak resin is rated to be 1, one with a rate of 1.0 or less is represented by ⊚, one with a rate of more than 1.0 and less than 1.2 is represented by ○, and one with a rate of at least 1.2 is represented by X.

Preparation Example 5

Preparation of CF$_2$=CFCF$_2$C(CF$_3$)(OCH$_2$OCH$_3$) CH$_2$CH=CH$_2$

Into a 10 L reactor made of glass, 758 g of CF$_2$ClCFClCF$_2$C(O)CF$_3$ and 4.5 L of dehydrated THF were charged and cooled to 0° C. 1.4 L of a 2M THF solution of CH$_2$=CHCH$_2$MgCl, was dropwise added thereto in a nitrogen atmosphere over a period of about 10.5 hours. After completion of the dropwise addition, the mixture was stirred at 0° C. for 30 minutes and at room temperature for 12 hours, whereupon 350 g of chloromethyl methyl ether was dropwise added. The mixture was further stirred at room temperature for 92 hours. 1.5 L of water was added, followed by liquid separation. The organic layer was concentrated by an evaporator, and the crude liquid was washed twice with water of 1.5 L. Then, it was distilled under reduced pressure to obtain 677 g of CF$_2$ClCFClCF$_2$C(CF$_3$)(OCH$_2$OCH$_3$) CH$_2$CH=CH$_2$ (53 to 55° C./0.17 kPa).

Then, into a 3 L reactor made of glass, 577 g of zinc and 1.3 L of dioxane were charged, and activation of zinc was carried out by iodine. Then, the reactor was heated to 100° C., and 677 g of $CF_2ClCFClCF_2C(CF_3)(OCH_2OCH_3)CH_2CH=CH_2$ synthesized as described above, was dropwise added thereto over a period of 2 hours. After completion of the dropwise addition, the mixture was stirred at 100° C. for 47 hours. The reaction solution was filtered and washed with a small amount of dioxane. To the filtrate, 2.5 L of water and 1.5 L of diethyl ether were added, followed by liquid separation. The organic layer was dried over anhydrous magnesium sulfate, followed by filtration to obtain a crude liquid. The crude liquid was concentrated by an evaporator, followed by distillation under reduced pressure to obtain 177 g of $CF_2=CFCF_2C(CF_3)(OCH_2OCH_3)CH_2CH=CH_2$ (43 to 45° C./0.6 kPa).

NMR Spectrum $^1$H NMR (399.8 MHz, solvent: $CDCl_3$, standard: tetramethylsilane) δ (ppm) 3.16 (broad, 2H), 3.44 (s, 3H), 4.95 (m, 2H), 5.22 (m, 2H), 5.92 (m, 1H).

$^{19}$F NMR (376.2 MHz, solvent: $CDCl_3$, standard: $CFCl_3$) δ (ppm): −72.5 (m, 3F), −92.9 (m, 1F), −106.8 (m, 1F), −109.7 (m, 2F), −183.0 (m, 1F).

Preparation Example 6

Preparation of $CF_2=CFCF_2C(CF_3)(OH)CH=CH_2$

Into a 2 L reactor made of glass, 104 g of $CF_2ClCFClCF_2C(O)CF_3$ and 600 ml of dehydrated THF were charged and cooled to 0° C. 370 ml of a 1M THF solution of $CH_2=CHMgBr$ was dropwise added thereto in a nitrogen atmosphere over a period of 7 hours. After completion of the dropwise addition, the mixture was stirred at 0° C. for 30 minutes and at room temperature for 15 hours, whereupon 200 ml of 2N hydrochloric acid was dropwise added. 200 ml of water and 300 ml of diethyl ether were added for liquid separation, and a diethyl ether layer was obtained as an organic layer. The organic layer was dried over magnesium sulfate, followed by filtration to obtain a crude liquid. The crude liquid was concentrated by an evaporator, followed by distillation under reduced pressure to obtain 85 g of $CF_2ClCFClCF_2C(CF_3)(OH)CH=CH_2$ (43 to 45° C./0.6 kPa).

Then, into a 500 ml reactor made of glass, 80 g of zinc and 220 ml of dioxane were charged, and activation of zinc was carried out by iodine. The reactor was heated to 100° C., and 80 g of $CF_2ClCFClCF_2C(CF_3)(OH)CH=CH_2$ prepared as described above, was dropwise added thereto over a period of 1 hours. After completion of the dropwise addition, the mixture was stirred at 100° C. for 40 hours. The reaction solution was filtered and washed with a small amount of dioxane. The filtrate was distilled under reduced pressure to obtain 37 g of $CF_2=CFCF_2C(CF_3)(OH)CH=CH_2$ (40 to 42° C./2.4 kPa).

NMR Spectrum $^1$H NMR (399.8 MHz, solvent: $CDCl_3$, standard: tetramethylsilane) δ (ppm): 4.89 (broad s, 1H), 5.71 (m, 1H), 5.96 (m, 2H).

$^{19}$F NMR (376.2 MHz, solvent: $CDCl_3$, standard: $CFCl_3$) δ (ppm): −74.1 (m, 3F), −91.9 (m, 1F), −106.7 (m, 1F), −113.1 (m, 2F), −182.9 (m, 1F).

Preparation Example 7

A solution having 5 g of polymer 2A obtained in Preparation Example 3 (hydroxyl group concentration: 6.3 mass %) dissolved in 25 ml of THF and a solution having 0.30 g of sodium hydroxide in 8.5 ml of methanol, were put into a 200 ml flask and thoroughly stirred overnight by a magnetic stirrer, whereupon the solvent was distilled off under reduced pressure. Then, 25 ml of THF was added, and further, a solution having 0.60 g of chloromethyl methyl ether dissolved in 10 ml of THF, was added. The polymer was gradually dissolved to obtain a white turbid solution.

The above solution was stirred for a few days at room temperature, and then, 110 ml of diethyl ether and 100 ml of pure water were added for liquid separation. The oil layer was washed with water, and the solvent was distilled off under reduced pressure. The obtained solid was dissolved in 30 ml of diethyl ether, followed by filtration by means of a filter of 0.45 μm. To the filtrate, hexane was added to flocculate the polymer, and the flocculated polymer was washed twice with hexane. The obtained polymer was dried for 16 hours by a vacuum drier (at most 1.7 kPa, 80° C.), to obtain 4.6 g of a polymer blocked with methoxymethyl groups (hereinafter referred to as MOM groups) (polymer 7A). By $^1$H-NMR (—O—$CH_2$—O— of the MOM group: 4.7 to 5.4 ppm (2H)), it was confirmed that 18 mol % of hydroxyl groups of polymer 7A were blocked (the blocked ratio was 18%).

Preparation Example 8

5.0 g of a polymer (hereinafter referred to as polymer 8A) blocked with MOM groups was obtained in the same manner as in Preparation Example 7 except that to 5 g of polymer 2A, 0.44 g of sodium hydroxide and 0.89 g of chloromethyl methyl ether were used. The blocked ratio of polymer 8A was 40%.

Preparation Example 9

4.3 g of a polymer (hereinafter referred to as polymer 9A) blocked with MOM groups was obtained in the same manner as in Preparation Example 7 except that to 5 g of polymer 2A, 0.59 g of sodium hydroxide and 1.19 g of chloromethyl methyl ether were used. The blocked ratio of polymer 9A was 58%.

Preparation Example 10

4.97 g of a polymer (hereinafter referred to as polymer 10A) blocked with MOM groups was obtained in the same manner as in Preparation Example 7 except that to 5 g of polymer 2A, 0.75 g of sodium hydroxide and 1.49 g of chloromethyl methyl ether were used. The blocked ratio of polymer 10A was 78%.

Preparation Example 11

4.4 g of a polymer (hereinafter referred to as polymer 11A) blocked with benzyloxy methyl groups (hereinafter referred to as BOM groups) was obtained in the same manner as in Preparation Example 7 except that to 5 g of polymer 2A, 0.44 g of sodium hydroxide and 1.88 g of chloromethyl benzyl ether were used. By $^1$H-NMR (—O—$CH_2$—O— of the BOM group: 4.6 to 5.4 ppm (2H)), it was confirmed that the blocked ratio of polymer 11A was 56%.

Preparation Example 12

4.1 g of a polymer (polymer 12A) blocked with mentyloxy methyl groups (hereinafter referred to as MM groups) was obtained in the same manner as in Preparation Example 7 except that to 5 g of polymer 2A, 0.44 g of sodium hydroxide and 2.46 g of chloromethyl methyl ether were used. By $^1$H-NMR (—O—$CH_2$—O— of the MM group: 4.8 to 5.4 ppm (2H)), it was confirmed that the blocked ratio of polymer 12A was 35%.

Preparation Example 13

5.1 g of a polymer (hereinafter referred to as polymer 13A) blocked with 2-methoxyethoxymethyl groups (hereinafter referred to as MEM groups) was obtained in the same manner as in Preparation Example 7 except that except that to 5 g of polymer 2A, 0.44 g of sodium hydroxide and 1.05 g of 2-methoxyethoxy methyl chloride were used. By $^1$H-NMR (—O—CH$_2$—O— of the MEM group: 4.7 to 5.4 ppm (2H)), it was confirmed that the blocked ratio of polymer 13A was 45%.

Preparation Example 14

5.0 g of a polymer (hereinafter referred to as polymer 14A) blocked with ethoxymethyl groups (hereinafter referred to as EOM groups) was obtained in the same manner as in Preparation Example 7 except that except that to 5 g of polymer 2A, 0.44 g of sodium hydroxide and 1.05 g of chloromethyl methyl ether were used. By $^1$H-NMR (—O—CH$_2$—O— of the MEM group: 4.7 to 5.4 ppm (2H)), it was confirmed that the blocked ratio of polymer 14A was 36%.

Preparation Example 15

5 g of the hydroxy group-containing fluorinated diene (hereinafter referred to as diene 1) obtained in Preparation Example 1, 5.7 g of the fluorinated diene (hereinafter referred to as diene 5) obtained in Preparation Example 5 and 23 g of methyl acetate were charged into a pressure resistant reactor made of glass having an internal capacity of 50 cc. Then, 0.24 g of perfluorobenzoyl peroxide was added as a polymerization initiator. The interior of the system was freeze-deaerated, and then, polymerization was carried out for 6 hours in a constant temperature shaking vessel (70° C.). After the polymerization, the reaction solution was dropwise added into hexane to reprecipitate the polymer, followed by vacuum drying at 150° C. for 12 hours. As a result, 8.5 g of a non-crystalline polymer (hereinafter referred to as polymer 15A) having a fluorinated cyclic structure in its main chain, was obtained. The composition of monomer units in polymer 15A as measured by $^{19}$F-NMR and $^1$H-NMR, was such that diene 1 units/diene 5 units=52/48 (molar ratio).

The molecular weight of the above polymer 15A as calculated as polystyrene, measured by GPC using THF as a solvent, was such that the number average molecular weight (Mn) was 12,000, and the weight average molecular weight (Mw) was 34,800, whereby Mw/Mn=2.90. Tg of the above polymer 15A as measured by a differential scanning calorimetry (DSC) was 129° C., and the 10% weight reduction temperature of the above polymer 15A as measured by the thermogravimetry analysis (TGA) was 363° C. Polymer 15A was a white powdery polymer at room temperature, and it was soluble in acetone, THF, ethyl acetate, methanol and 2-perfluorohexyl ethanol and was insoluble in dichloropentafluoropropane, perfluoro(2-butyltetrahydrofuran), and perfluoro-n-octane.

By $^{19}$F-NMR and $^1$H-NMR, it was confirmed to be a cyclized polymer having the same repeating structure as the cyclized polymer obtained in Preparation Examples 2 and 3.

Preparation Example 16

A hydroxyl group-containing fluoropolymer was produced by polymerizing the hydroxyl group-containing fluorinated diene prepared in Preparation Example 6 in the same manner as in Preparation Example 3. The molecular weight of this polymer as calculated as polystyrene, measured by GPC using THF as a solvent, was such that the number average molecular weight (Mn) was 10,000, and the weight average molecular weight (Mw) was 25,800, whereby Mw/Mn=2.58. Tg measured by the differential scanning calorimetry was 149° C., and the polymer was a white powdery polymer at room temperature. Further, the 10% weight reduction temperature measured by the thermogravimetry analysis (TGA) was 365° C. The obtained polymer was soluble in acetone, THF, ethyl acetate, methanol and 2-perfluorohexyl ethanol and was insoluble in dichloropentafluoropropane, perfluoro(2-butyltetrahydrofuran), and perfluoro-n-octane.

The above polymer was treated in the same manner as in Preparation Example 7 to prepare a polymer wherein a part of hydroxyl groups were blocked. Namely, 4.8 g of a polymer (hereinafter referred to as polymer 16A) blocked with MOM groups was obtained in the same manner as in Preparation Example 7 except that to 5 g of the above polymer, 0.40 g of sodium hydroxide and 0.8 g of chloromethyl methyl ether were used. The blocked ratio of polymer 16A was 36%.

Examples 5 to 14

1 g of one of the polymers 7A to 16A prepared in Preparation Examples 7 to 16 and 0.05 g of trimethylsulfonium triflate were dissolved in 10 g of propylene glycol monomethyl ether acetate, followed by filtration by means of a PTFE filter having a pore diameter of 0.2 μm to obtain a resist composition.

The above resist composition was spin-coated on a silicon substrate treated with hexamethyldisilazane, followed by heat treatment at 80° C. for 2 minutes to form a resist film having a thickness of 0.3 μm. In an exposure test apparatus flushed with nitrogen, the substrate having the above resist film formed, was placed, and a mask having a pattern drawn by chromium on a quartz plate, was put thereon in close contact therewith. ArF laser beams were irradiated through the mask, whereupon, after exposure at 100° C. for 2 minutes, baking was carried out. The development was carried out at 23° C. for 3 minutes with a tetramethylammonium hydroxide aqueous solution (2.38 mass %), followed by washing with pure water for 1 minute. The light transmittance of the resist film and the development test results are shown in Table 2.

TABLE 2

| Polymer | Transmittance of light of 193 nm (%) | Transmittance of light of 157 nm (%) | Exposure (mJ/cm$^2$) | Line and space width (L&S = 1/1) |
|---|---|---|---|---|
| 7A | 85 | 55 | 14 | 0.25 |
| 8A | 82 | 51 | 18 | 0.25 |
| 9A | 80 | 48 | 20 | 0.25 |
| 10A | 76 | 47 | 22 | 0.25 |
| 11A | 40 | 30 | 25 | 0.28 |
| 12A | 67 | 48 | 20 | 0.25 |
| 13A | 83 | 49 | 20 | 0.25 |
| 14A | 81 | 50 | 20 | 0.25 |
| 15A | 80 | 51 | 18 | 0.30 |
| 16A | 83 | 55 | 17 | 0.30 |

Industrial Applicability

The resist composition of the present invention is excellent particularly in transparency to radiation and dry etching properties as a chemical amplification type resist and further is capable of readily forming a resist pattern excellent in sensitivity, resolution, evenness, heat resistance, etc.

The entire disclosures of Japanese Patent Application No. 2001-034023 filed on Feb. 9, 2001 and Japanese Patent Application No. 2001-219570 filed on Jul. 19, 2001 including specifications, claims and summaries are incorporated herein by reference in their entireties.

What is claimed is:

1. A resist composition comprising a fluoropolymer (A); an acid-generating compound (B) which generates an acid under irradiation with light; and an oranic solvent (C), wherein the fluoropolymer (A) is a fluoropolymer having repeating units formed by cyclopolymerization of a fluorinated diene represented by the formula (1)

$$CF_2=CR^1-O-CR^2=CH_2 \quad (1)$$

where each of $R^1$ and $R^2$, which are independent of each other, is a hydrogen atom, a fluorine atom, a methyl group or a trifluoromethyl group;

Q is a bivalent organic group having a blocked acidic group capable of forming an acidic group by an acid or a group which can be converted to such a blocked acidic group;

the fluorinated diene has blocked acidic groups; and in a case where Q is the bivalent organic group having a group which can be converted to a blocked acidic group, said group is converted to a blocked acidic group after the cyclopolymerization.

2. The resist composition according to claim 1, wherein Q is a bivalent organic group represented by the formula (2):

$$-R^3-C(R^5)(R^6)-R^4- \quad (2)$$

where each of $R^3$ and $R^4$, which are independent of each other, is a single bond, an oxygen atom, an alkylene group having at most 3 carbon atoms, which may have an etheric oxygen atom, or a fluoroalkylene group having at most 3 carbon atoms, which may have an etheric oxygen atom;

$R^5$ is a hydrogen atom, a fluorine atom, an alkyl group having at most 3 carbon atoms or a fluoroalkyl group having at most 3 carbon atoms; and $R^6$ is a blocked acidic group, an acidic group, or a monovalent organic group having a blocked acidic group or an acidic group.

3. The resist composition according to claim 1, wherein the acidic group is an acidic hydroxyl group, and the blocked acidic group is a blocked acidic hydroxyl group.

4. The resist composition according to claim 1, wherein the fluorinated diene is a fluorinated diene represented by the formula (4) or (5):

$$CF_2=CFCF_2C(-X^2)(CF_3)CH_2CH=CH_2 \quad (4)$$

$$CF_2=CFCF_2CH(-(CH_2)_pC(CF_3)_2-X^2)CH_2CH=CH_2 \quad (5)$$

where $X^2$ is $O(t-C_4H_9)$, $OCH_2OCH_3$, $OCOO(t-C_4H_9)$, $OCH(CH_3)OC_2H_5$ or a 2-tetrahydropyranyloxy group; and p is an integer of from 1 to 3.

5. The resist composition according to claim 1, wherein the fluoropolymer (A) is a copolymer comprising repeating units formed by cyclopolymerization of the fluorinated diene represented by the formula (1) and repeating units formed by polymerization of other monomers; and the proportion of the repeating units formed by polymerization of other monomers is at most 30 mol %.

6. A method of using a resist composition, the method comprising exposing the resist composition of claim 1 to ultraviolet rays having a wavelength of at most 200 nm.

7. The method according to claim 6, wherein the ultraviolet rays having a wavelength of at most 200 nm are in ArF excimer laser beams or $F_2$ excimer laser beams.

8. A process for forming a pattern, the process comprising coating the resist composition of claim 1 on a substrate, then removing the organic solvent (C) to form a thin film of a resist comprising the fluoropolymer (A) and the acid-generating compound (B), then irradiating the thin film with ultraviolet rays having a wavelength of at most 200 nm, generating an acid from the acid-generating compound (B), and forming the pattern.

9. The process according to claim 8, wherein the ultraviolet rays having a wavelength of at most 200 nm are in ArF excimer laser beams or $F_2$ excimer laser beams.

* * * * *